United States Patent [19]
Hirano et al.

[11] Patent Number: 6,111,532
[45] Date of Patent: Aug. 29, 2000

[54] WAVEFORM SHAPER AND SIGMA-DELTA D/A CONVERTER

[75] Inventors: Masamitsu Hirano; Masao Noro, both of Hamamatsu, Japan

[73] Assignee: Yamaha Corporation, Shizuoka-ken, Japan

[21] Appl. No.: 09/169,987

[22] Filed: Oct. 13, 1998

[51] Int. Cl.$^7$ .................................................. H03M 3/00
[52] U.S. Cl. .......................................... 341/143; 341/144
[58] Field of Search ..................................... 341/143, 144

[56] References Cited

U.S. PATENT DOCUMENTS

| | | | |
|---|---|---|---|
| 4,947,171 | 8/1990 | Pfeifer et al. | 341/143 |
| 5,225,835 | 7/1993 | Majima et al. | 341/143 |

Primary Examiner—Trong Phan
Attorney, Agent, or Firm—Reed Smith Hazel & Thomas LLP

[57] ABSTRACT

There are provided a waveform shaper that shapes a waveform of a one-bit data signal obtained by subjecting an input data signal to sigma-delta modulation, to generate an output data signal, and a sigma-delta D/A converter incorporating the waveform shaper. A clock jitter-detecting device detects jitter of a clock signal used for generating the one-bit data signal and generates an error signal indicative of the detected jitter of the clock signal. An amplitude-adjusting device shapes the waveform of the one-bit data signal by using the clock signal, and adjusts amplitude of the shaped one-bit data signal in response to the error signal, to generate the output data signal.

10 Claims, 4 Drawing Sheets

FIG.3A  Db ——————————————————————— H
FIG.3B  CK 
FIG.3C  OUTPUT FROM 311 

DUTY FACTOR 40%   DUTY FACTOR 50%   DUTY FACTOR 60%

DUTY FACTOR 40%
FIG.3F  GS 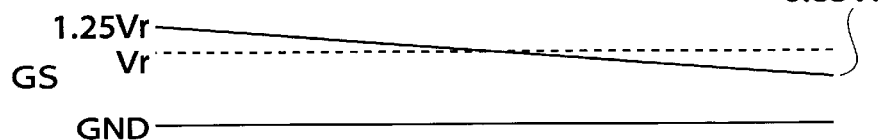

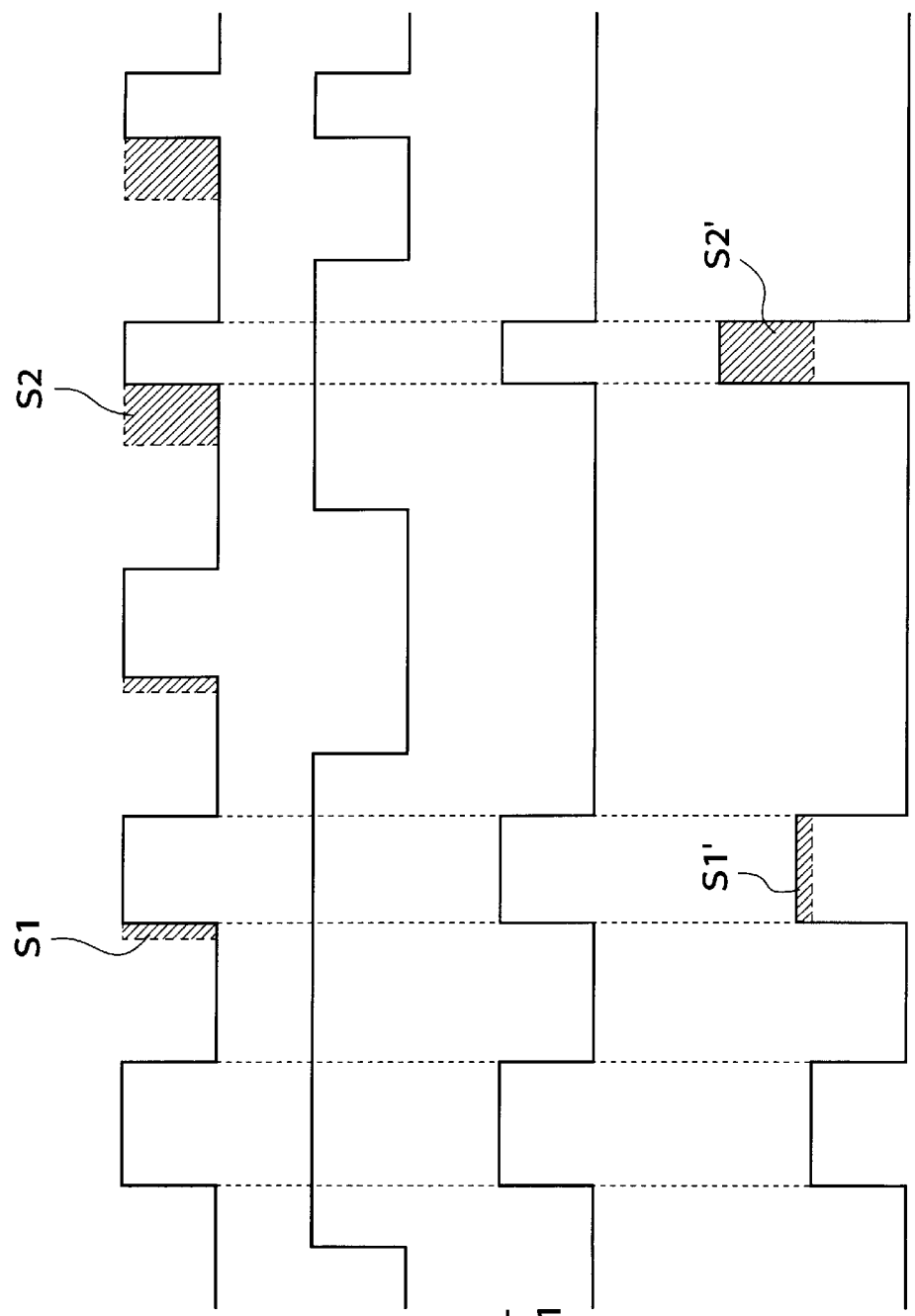
FIG.4A CK
FIG.4B Da
FIG.4C OUTPUT FROM 41
FIG.4D Da'

WAVEFORM SHAPER AND SIGMA-DELTA D/A CONVERTER

BACKGROUND OF THE INVENTION

1. Field of the Invention

This invention relates to a waveform shaper and a sigma-delta (ΣΔ) D/A converter that generate a high-accuracy analog output through correction of clock jitter.

2. Prior Art

In general, when oversampling is carried out, as the sampling frequency is higher, the quantization noise is dispersed over a wider frequency region to lower the noise spectrum level in each unit frequency band, and accordingly the signal-to-noise ratio in a signal frequency band is improved. A sigma-delta D/A converter conventionally employs a combination of a known oversampling technique and a technique called "noise shaping". The technique of noise shaping largely reduces noise level in an audible frequency band by shaping the quantization noise, i.e. changing the noise spectrum of quantization noise from a flat response (white noise) to a response where the noise level is low at lower frequencies and high at higher frequencies.

In the sigma-delta D/A converter, a low-pass filter is provided at a later stage thereof for removing higher frequency components than the frequency band of a fundamental wave. To prevent clock jitter from adversely affecting the filtering operation, the low-pass filter is conventionally integrated in an LSI in the form of a switched capacitor circuit. Further, an sigma-delta A/D converter is also constructed using a switched capacitor circuit.

The switched capacitor circuit performs switching of the supply of current to a capacitor thereof to thereby use the capacitor as an equivalent of a resistor. Therefore, to integrate the switched capacitor circuit in an LSI, a capacitor is required to be provided within the LSI. Such a capacitor is formed by reverse bias of a PN junction and a capacitance between two poly-silicon layers or between a poly-silicon layer and a metal layer, the capacity of which is dependent on the surface area of the associated layers. Accordingly, when the switched capacitor circuit is integrated within the LSI, the capacitor occupies a large area, jeopardizing reduction of the chip size and higher-density integration of the integrated circuit.

On the other hand, when the sigma-delta D/A converter is constructed by integrating a waveform shaper and an active filter as a low-pass filter in an LSI, instead of using the switched capacitor circuit, waveform shaping has to be carried out by an internal clock which is not free from jitter, so that the pulse width of one-bit pulse data from the sigma-delta modulator varies to cause noise or waveform distortion. These problems make it difficult to integrate the sigma-delta D/A converter in an LSI. Therefore, it is a conventional technique that component parts of the sigma-delta D/A converter up to the sigma-delta modulator are integrated in the LSI, and output pulses from the sigma-delta modulator are subjected to waveform shaping outside the LSI by using an external clock with small jitter, followed by filtering the shaped pulses by an active filter or the like. This requires, however, an external circuit in addition to the LSI, so that the size and cost of the sigma-delta D/A converter are increased.

SUMMARY OF THE INVENTION

It is an object of the invention to provide a waveform shaper and a sigma-delta D/A converter incorporating the waveform shaper which do not occupy much space to enable the same to be integrated in an LSI but have high-accuracy analog output characteristics.

To attain the above object, according to a first aspect of the invention, there is provided a waveform shaper that shapes a waveform of a one-bit data signal obtained by subjecting an input data signal to sigma-delta modulation, to generate an output data signal, comprising a clock jitter-detecting device that detects jitter of a clock signal used for generating the one-bit data signal and generates an error signal indicative of the detected jitter of the clock signal, and an amplitude-adjusting device that shapes the waveform of the one-bit data signal by using the clock signal, and adjusts amplitude of the shaped one-bit data signal in response to the error signal, to generate the output data signal.

Preferably, the clock jitter-detecting device comprises an AND circuit that receives a detecting data signal having a predetermined bit pattern, and generates an output signal indicative of a logical product of the detecting data signal and the clock signal, a low-pass filter that removes high-frequency components of the output signal from the AND circuit, and a comparator that compares voltage of an output signal from the low-pass filter and a predetermined reference voltage to generate the error signal.

Preferably, the amplitude-adjusting device adjusts the amplitude of the shaped one-bit data signal in response to the error signal in a manner such that an area defined by a waveform of each pulse of the output data signal is constant, to generate the output data signal.

More preferably, the amplitude-adjusting device comprises a second AND circuit that generates the shaped one-bid data signal in the form of an output signal indicative of a logical product of the one-bit data signal and the clock signal, and a buffer that receives the output signal from the second AND circuit and adjusts the amplitude of the shaped one-bit data signal by generating an output voltage that varies between a high level equal to a power source voltage set according to the error signal and a low level equal to a ground voltage, to thereby generate the output data signal.

Further preferably, the clock jitter-detecting device includes a waveform-shaping device comprising the AND circuit, and a second buffer that receives the output signal from the AND circuit and adjusts amplitude of the output signal from the AND circuit by generating an output voltage that varies between the high level equal to the power source voltage set according to the error signal and the low level equal to the ground voltage.

According to a second aspect of the invention, there is provide a sigma-delta D/A converter, comprising a sigma-delta modulator that subjects an input data signal to sigma-delta modulation to generate a one-bit data signal, a clock jitter-detecting device that detects jitter of a clock signal used for generating the one-bit data signal to generate an error signal indicative of the detected jitter of the clock signal, and an amplitude-adjusting device that shapes a waveform of the one-bit data signal by using the clock signal, adjusts amplitude of the shaped one-bit data signal in response to the error signal, to generate an output data signal.

The above and other objects, features and advantages of the invention will become more apparent from the following detailed description taken in conjunction of the accompanying drawings.

BRIEF DESCRIPTION OF THE DRAWINGS

FIGS. 3A to 3F collectively form a timing chart which is useful in explaining the operation of a clock jitter-detecting section of the sigma-delta D/A converter, in which:

FIG. 3A shows the waveform of a detecting data signal Db;

FIG. 3B shows the waveform of a clock signal CK;

FIG. 3C shows the waveform of an output data signal from an AND circuit 311 appearing in FIG. 2;

FIG. 3D shows a change in the duty factor of the clock signal CK;

FIG. 3E shows the operation of a buffer 312 appearing in FIG. 2; and

FIG. 3F shows the error signal GS; and

FIGS. 4A to 4D collectively form a timing chart which is useful in explaining the operation of a waveform shaping section of the sigma-delta D/A converter, in which:

FIG. 4A shows the waveform of the clock signal CK;

FIG. 4B shows the waveform of a one-bit data signal Da;

FIG. 4C shows the waveform of an output data signal from an AND circuit 41 appearing in FIG. 2; and FIG. 4D shows the waveform of the corrected one-bit data signal Da'.

DETAILED DESCRIPTION

The invention will now be described with reference to drawings showing an embodiment thereof.

Figure 1:
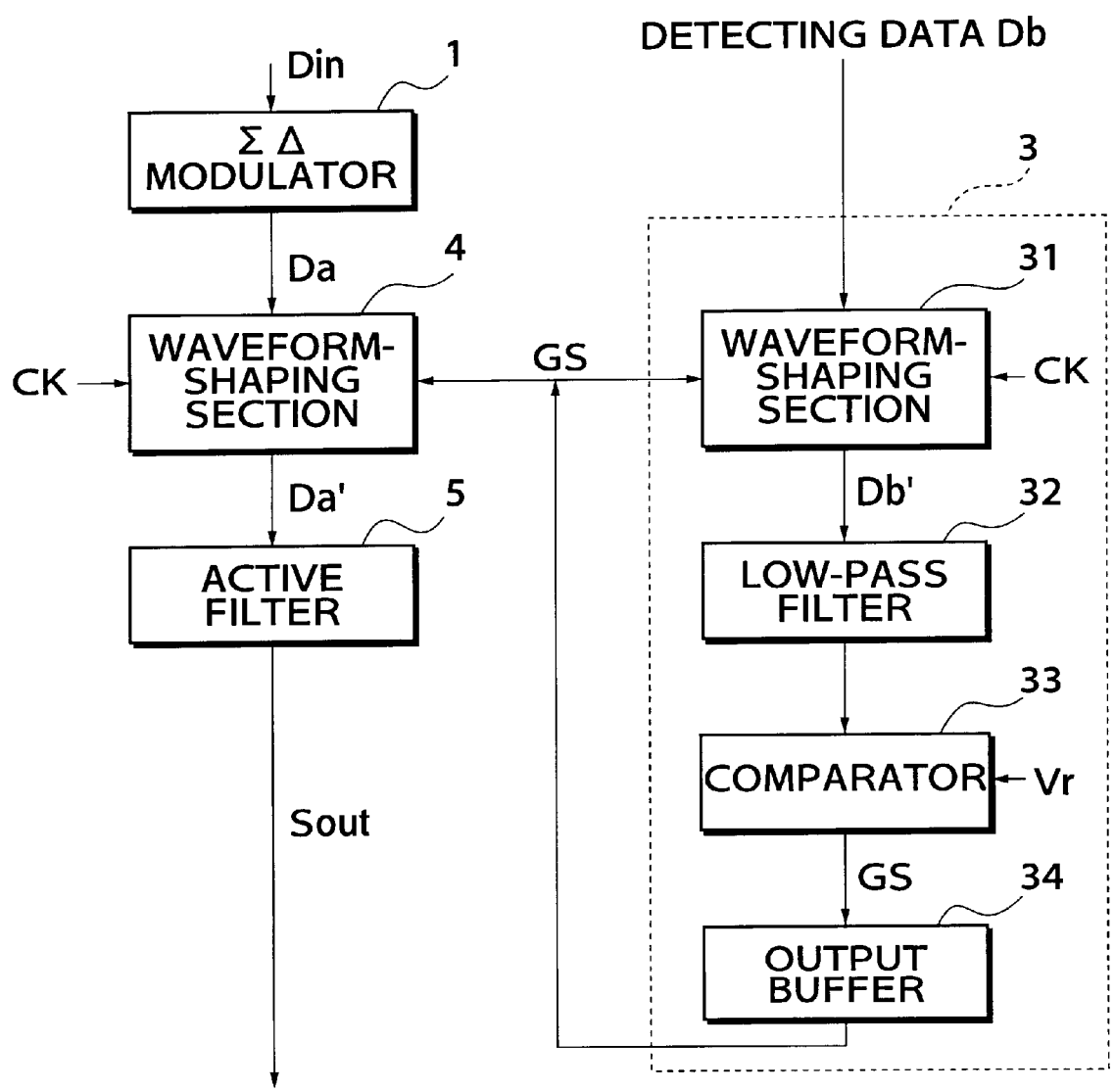
FIG. 1 is a block diagram schematically showing functional blocks constituting a sigma-delta D/A converter using a waveform shaper, according to an embodiment of the invention.

FIG. 1 show functional blocks constituting a sigma-delta D/A converter using a waveform shaper, according to an embodiment of the invention. In the figure, reference numeral 1 designates a sigma-delta modulator which subjects a multi-bit input data signal Din to sigma-delta modulation to thereby convert the same to a one-bit pulse data signal.

Reference numeral 3 designates a clock jitter-detecting section for detecting jitter of a clock signal CK to generate an error signal GS indicative of the detected jitter. The clock jitter-detecting section 3 is comprised of a waveform-shaping section 31, a low-pass filter 32, a comparator 33, and an output buffer 34.

First, the waveform-shaping section 31 shapes the waveform of a detecting data signal Db based on the clock signal CK to generate a shaped detecting data signal Db'. Further, the waveform-shaping section 31 adjusts the amplitude of the shaped detecting data signal Db' to be generated, in response to the error signal GS. The detecting data signal Db may be set to a desired value, but in the illustrated embodiment, the detecting data signal Db supplied to the clock jitter-detecting section 3 has a bit pattern consisting of all bits of "1" so as to pass the clock signal CK with jitter as it is through the section 3.

The low-pass filter 32 receives the shaped detected data signal Db' and removes high-frequency components from the signal Db' to generate an output signal. To this end, the cut-off frequency of the low-pass filter 32 is set such that the fundamental wave components of the detecting data signal Db are fully suppressed to minimize the influence of the bit pattern (all bits of "1") of the detecting data signal. This causes the output signal from the low-pass filter 32 to represent an area defined by the waveform of the shaped detecting data signal Db'.

The comparator 33 compares the output signal from the low-pass filter 32 with a reference voltage signal Vr input thereto from an external voltage source to generate the error signal GS. The reference voltage Vr assumes a fixed value determined according to the bit pattern of the detecting data signal Db. More specifically, the value of the reference voltage Vr is set such that it is equal to a voltage value of the output signal from the low-pass filter 32 to be assumed when that the clock signal CK has no jitter. If the clock signal CK has jitter, an area formed by the waveform of the shaped detecting data signal Db' corresponding to one pulse is increased or decreased under the influence of jitter. Therefore, the jitter of the clock signal CK can be detected through comparison between the output signal from the low-pass filter 32 and the reference voltage Vr.

The output buffer 34 at the following stage converts the error signal GS output from the comparator 33 into a low-impedance error signal and delivers the same to the waveform-shaping section 31. Based on the error signal GS thus generated, the waveform-shaping section 31 adjusts the amplitude of the shaped detecting data signal Db' such that the area defined by the waveform of the shaped detecting data signal Db' becomes equal to a value which the area should take when the clock signal CK has no jitter. More specifically, if the pulse width of the shaped detecting data signal Db' is larger than a proper value due to jitter of the clock signal CK, the amplitude of the shaped detecting data signal Db' is decreased. On the other hand, if the pulse width of the shaped detecting data signal Db' is smaller than the proper value due to jitter of the clock signal CK, the amplitude of the shaped detecting data signal Db' is increased.

In FIG. 1, reference numeral 4 designates a waveform-shaping section having the same construction as the waveform-shaping section 31. The waveform-shaping section 4 is responsive to the error signal GS supplied from the output buffer 34, for adjusting the amplitude of a one-bit data signal Da from the sigma-delta modulator 1 to generate a corrected one-bit data signal Da'. Since the error signal represents the jitter of the clock signal CK, an area formed by the waveform of each pulse of the corrected one-bit data signal Da' can be made constant through adjusting the amplitude of the one-bit data signal Da similarly to the waveform-shaping section 31 described above.

Reference numeral 5 designates an active filter for removing high-frequency components of the corrected one-bit data signal Da' to generate an analog output signal Sout. Since the amplitude of the corrected one-bit data signal Da' has been corrected such that the area defined by the waveform of each pulse thereof becomes constant, as described above, the analog output signal Sout can be generated with high accuracy through accumulation of the corrected one-bit data signal Da' by the active filter 5 even if the one-bit data signal Da has a variation in timing caused by the jitter of the clock signal.

The sigma-delta D/A converter constructed as described above is capable of detecting jitter of the clock signal CK and correcting the one-bit data Da at its waveform-shaping section 4 according to the amount of the jitter. This dispenses with the provision of an additional high-accuracy clock signal for waveform shaping. As a result, it is possible to integrate the component parts of the sigma-delta modulator 1 to the active filter 5 in an LSI.

Next, an example of a circuit configuration realizing the functional configuration described above will be described.

Figure 2:
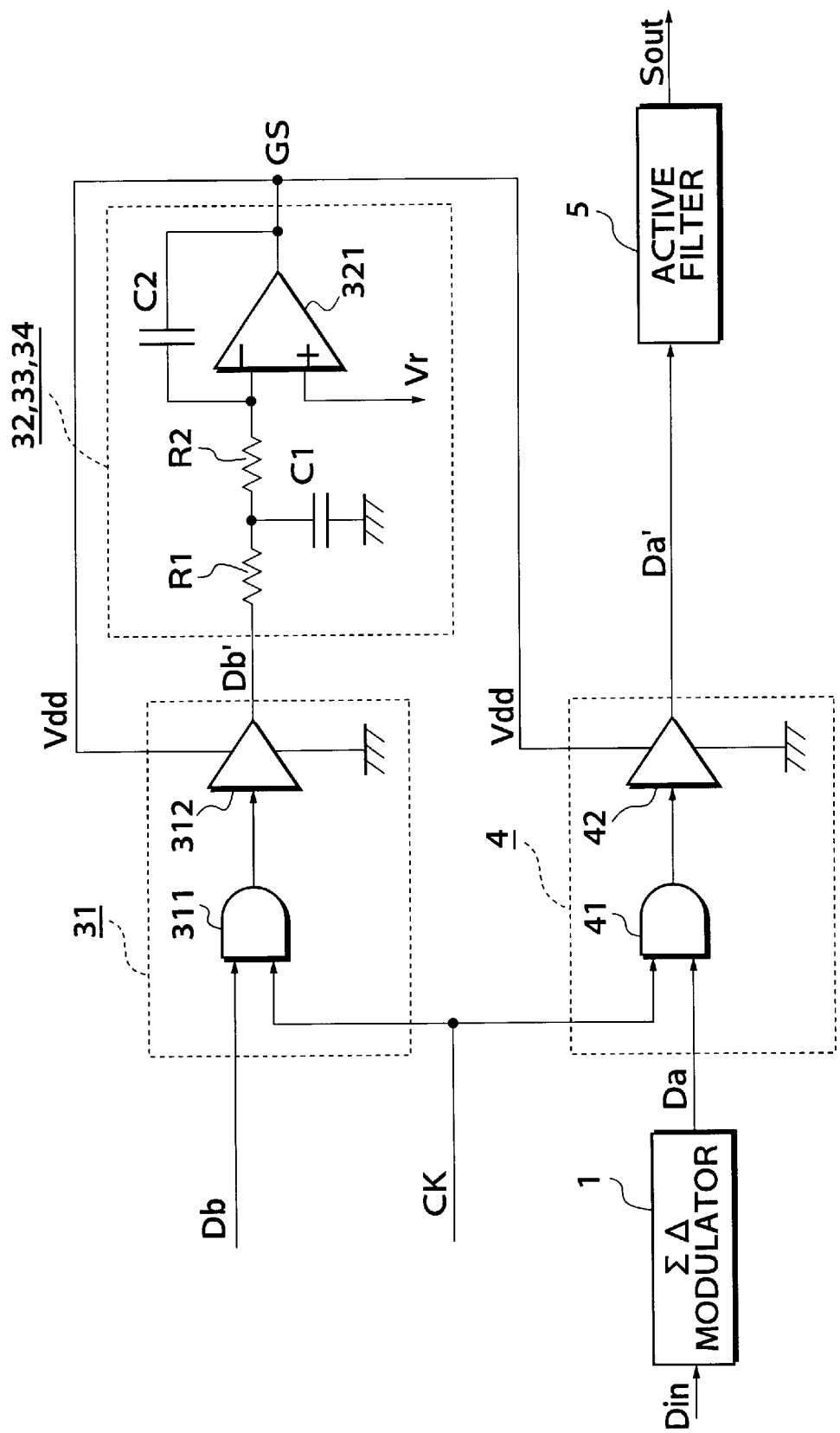
FIG. 2 is a circuit diagram showing the circuit configuration of the sigma-delta D/A converter according to the embodiment.

FIG. 2 shows the circuit configuration of the sigma-delta D/A converter according to the present embodiment. It should be noted that component elements and parts of the circuit corresponding to those appearing in FIG. 2 are designated by identical reference numerals.

As shown in the figure, the waveform-shaping section 31 is comprised of an AND circuit 311 and a buffer 312. The AND circuit 311 generates an output data signal indicative of a logical product of the detecting data signal Db and the clock signal CK. In the illustrated example, the detecting data signal Db having a bit pattern of all bits of "1" is input to the AND circuit 311, and hence the clock signal CK is allowed to pass through the AND circuit 311 as it is according to transfer characteristics of the AND circuit 311.

The output data signal from the AND circuit 311 is supplied to the buffer 312 that generates the shaped detecting data signal Db' which varies in voltage between a low level equal to ground voltage and a high level equal to a power source voltage Vdd. Therefore, the amplitude of the shaped detecting data signal Db' is adjusted according to the power source voltage Vdd.

The low-pass filter 32 is comprised of resistors R1, R2, capacitors C1, C2, and an operational amplifier 321. For instance, if the input data signal Din is a data signal having a voice band, and at the same time the clock signal frequency is 6 MHz, it is preferred that the cut-off frequency of the low-pass filter 32 is set to several hundreds KHz. Further, the operational amplifier 321 receives the reference voltage Vr at a positive input terminal thereof and the output signal from the low-pass filter 32 at a negative input terminal thereof. Therefore, the output signal from the low-pass filter 32 is compared with the reference voltage Vr, and a result of the comparison is output as the error signal GS. In this sense, the operational amplifier 321 functions as the comparator 33. Further, the operational amplifier 321 has a low output impedance, and hence the operational amplifier 321 functions as the output buffer 34 as well.

Next, the waveform-shaping section 4 is comprised of an AND circuit 41 and a buffer 42. The AND circuit 41 generates an output signal indicative of a logical product of the one-bit data signal Da and the clock signal CK. The relationship in phase between the one-bit data signal Da and the clock signal CK is such that a high-level period of the clock signal CK falls within a corresponding high-level period of the one-bit data signal Da. The AND circuit 41 is identical in construction to the AND circuit 311. The buffer 42 is also identical in construction to the buffer 312.

The error signal GS is supplied in a feedback manner to the power source voltage Vdd of the buffer 312 such that an area defined by the waveform of each pulse of the shaped detecting data signal Db' remains constant even if the pulse width of the clock signal CK varies due to jitter.

Further, the error signal GS is also supplied to the power source voltage Vdd of the buffer 42, and therefore the corrected one-bit data signal Da' output from the buffer 42 has its amplitude adjusted according to the error signal GS. This makes constant an area defined by the waveform of each pulse of the corrected one-bit data signal Da'. Thus, a corrected one-bit data signal Da' which is corrected in respect of jitter of the clock signal CK can be obtained, and through attenuation of high-frequency components of the corrected one-bit data signal Da', the analog output signal Sout with high accuracy is generated.

Next, the operation of the sigma-delta D/A converter shown in FIG. 2 will be described. FIGS. 3A to 3F collectively form a timing chart which is useful in explaining the operation of the clock jitter-detecting section 3.

First, if the detecting data signal Db has a bit pattern of all bits of "1", it has a waveform constantly at a high level as shown in FIG. 3A. On the other hand, if the waveform of the clock signal CK is as shown in FIG. 3B, the waveform of the output data signal from the AND circuit 311 almost agrees with that of the clock signal CK, as shown in FIG. 3C.

Figure 3D:
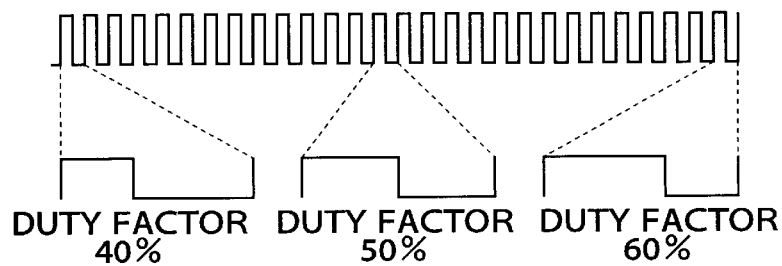

Let it be assumed that jitter occurs to the clock signal CK during a time period T, resulting in a change in the duty factor of the clock signal CK from 38% to 62%. FIG. 3D illustrates the change. For instance, if the duty factor of the clock signal CK is 38%, the duty factor of the output data signal from the AND circuit 311 also becomes equal to 38%. If the output data signal is supplied to the buffer 312, the amplitude of the output data signal is adjusted by the error signal GS to thereby generate the shaped detecting data signal Db'.

Figure 3E:
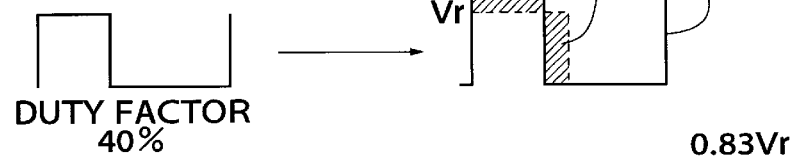

FIG. 3E shows the operation of the buffer 312. The output data signal from the AND circuit 311 is shown on the left side, and the shaped detecting data signal Db' on the right ride. The waveform of the shaped detecting data signal Db' to be assumed when the clock signal CK has no jitter is shown by broken lines.

As shown in the figure, the pulse width of the shaped detecting data signal Db' agrees with the output data signal from the AND circuit 311. On the other hand, the amplitude of the shaped detecting data signal Db' is adjusted by the error signal GS. In this example, the duty factor of the output data signal is 38%, of which the pulse width is narrower compared with a case in which the duty factor is 50% which is assumed when the clock signal CK has no jitter. Therefore, the amplitude of the output data signal is adjusted so as to compensate for the reduced pulse width. More specifically, the amplitude of the output data signal is adjusted such that the area S shown in the right-side portion of FIG. 3E is equal to the area S' shown in the same. As a result, the error signal GS as shown in FIG. 3F is generated in response to the change of the duty factor of the clock signal CK from 38% to 62% which takes place over the time period T.

Next, the operation of the waveform-shaping section 4 will be described in detail. FIG. 4A shows a waveform of the clock signal CK having jitter, indicated by solid lines, and portions of the waveform to be assumed when the clock signal CK has no jitter, indicated by broken lines. If the one-bit data signal Da has a waveform as shown in FIG. 4B, the output data signal from the AND circuit 41 has a waveform as shown in FIG. 4C.

Similarly to the inverting buffer 312 described above, the buffer 42 adjusts the amplitude of the one-bit data signal Da in response to the error signal GS such that the area defined by the waveform of each pulse becomes constant, so that the corrected one-bit data signal Da' has a waveform as shown in FIG. 4D. In this case, the hatched areas S1', S2' shown in FIG. 4D are made equal to the hatched areas S1, S2 shown in FIG. 4A. Therefore, even if the pulse width of the shaped data signal (the output data signal from the AND circuit 41) varies due to jitter of the clock signal CK, the area formed by the waveform of each pulse can be made constant.

This makes it possible to attain high accuracy of analog output characteristics of the D/A converter without being affected by jitter of the clock signal, even if the switched capacitor circuit is not employed. Further, it is not necessary to additionally generate a clock signal having little jitter for shaping the waveform of the detecting data signal by the clock signal, which can dispense with a special or dedicated clock-generating circuit, and further facilitates integration of the sigma-delta D/A converter in an LSI.

Although in the above embodiment, to detect jitter of the clock signal CK, the AND circuit 311 is provided to calculate the logical product of the detecting data signal Db and the clock signal CK, this is not limitative, but the clock signal CK may be directly supplied to the input of the buffer 312.

However, jitter can be detected more accurately when a circuit having the same construction as the clock jitter-detecting section 3 is employed to detect jitter of the clock signal CK, as in the present embodiment.

What is claimed is:

1. A waveform shaper that shapes a waveform of a one-bit data signal obtained by subjecting an input data signal to sigma-delta modulation, to generate an output data signal, comprising:

a clock jitter-detecting device that detects jitter of a clock signal used for generating said one-bit data signal and generates an error signal indicative of the detected jitter of said clock signal; and an amplitude-adjusting device that shapes said waveform of said one-bit data signal by using said clock signal, and adjusts amplitude of the shaped one-bit data signal in response to said error signal, to generate said output data signal.

2. A waveform shaper according to claim 1, wherein said clock jitter-detecting device comprises:

an AND circuit that receives a detecting data signal having a predetermined bit pattern, and generates an output signal indicative of a logical product of said detecting data signal and said clock signal;

a low-pass filter that removes high-frequency components of said output signal from said AND circuit; and a comparator that compares voltage of an output signal from said low-pass filter and a predetermined reference voltage to generate said error signal.

3. A waveform shaper according to claim 1, wherein said amplitude-adjusting device adjusts the amplitude of the shaped one-bit data signal in response to said error signal in a manner such that an area defined by a waveform of each pulse of said output data signal is constant, to generate said output data signal.

4. A waveform shaper according to claim 2, wherein said amplitude-adjusting device adjusts the amplitude of the shaped one-bit data signal in response to said error signal in a manner such that an area defined by a waveform of each pulse of said output data signal is constant, to generate said output data signal.

5. A waveform shaper according to claim 3, wherein said amplitude-adjusting device comprises a second AND circuit that generates the shaped one-bid data signal in the form of an output signal indicative of a logical product of said one-bit data signal and said clock signal, and a buffer that receives said output signal from said second AND circuit and adjusts the amplitude of the shaped one-bit data signal by generating an output voltage that varies between a high level equal to a power source voltage set according to said error signal and a low level equal to a ground voltage, to thereby generate said output data signal.

6. A waveform shaper according to claim 4, wherein said amplitude-adjusting device comprises a second AND circuit that generates the shaped one-bid data signal in the form of an output signal indicative of a logical product of said one-bit data signal and said clock signal, and a buffer that receives said output signal from said second AND circuit and adjusts the amplitude of the shaped one-bit data signal by generating an output voltage that varies between a high level equal to a power source voltage set according to said error signal and a low level equal to a ground voltage, to thereby generate said output data signal.

7. A waveform shaper according to claim 6, wherein said clock jitter-detecting device includes a waveform-shaping device comprising said AND circuit, and a second buffer that receives said output signal from said AND circuit and adjusts amplitude of said output signal from said AND circuit by generating an output voltage that varies between said high level equal to said power source voltage set according to said error signal and said low level equal to said ground voltage.

8. A sigma-delta D/A converter, comprising:

a sigma-delta modulator that subjects an input data signal to sigma-delta modulation to generate a one-bit data signal;

a clock jitter-detecting device that detects jitter of a clock signal used for generating said one-bit data signal to generate an error signal indicative of the detected jitter of said clock signal; and an amplitude-adjusting device that shapes a waveform of said one-bit data signal by using said clock signal, and adjusts amplitude of the shaped one-bit data signal in response to said error signal, to generate an output data signal.

9. A sigma-delta D/A converter according to claim 8, wherein said clock jitter-detecting device comprises:

an AND circuit that receives a detecting data signal having a predetermined bit pattern, and generates an output signal indicative of a logical product of said detecting data signal and said clock signal;

a low-pass filter that removes high-frequency components of said output signal from said AND circuit; and a comparator that compares voltage of an output signal from said low-pass filter and a predetermined reference voltage to generate said error signal.

10. A sigma-delta D/A converter according to claim 8, wherein said amplitude-adjusting device adjusts the amplitude of the shaped one-bit data signal in response to said error signal in a manner such that an area defined by a waveform of each pulse of said output data signal is constant, to generate said output data signal.

* * * * *